(12) United States Patent
Tian et al.

(10) Patent No.: US 9,048,070 B2
(45) Date of Patent: Jun. 2, 2015

(54) DIELECTRIC WINDOW FOR PLASMA TREATMENT DEVICE, AND PLASMA TREATMENT DEVICE

(71) Applicant: TOKYO ELECTRON LIMITED, Tokyo (JP)

(72) Inventors: Caizhong Tian, Osaka (JP); Naoki Matsumoto, Miyagi (JP); Koji Koyama, Miyagi (JP); Naoki Mihara, Miyagi (JP); Kazuki Takahashi, Miyagi (JP); Jun Yoshikawa, Miyagi (JP); Kazuki Moyama, Miyagi (JP); Takehiro Tanikawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/357,155

(22) PCT Filed: Nov. 8, 2012

(86) PCT No.: PCT/JP2012/079006
§ 371 (c)(1),
(2) Date: May 8, 2014

(87) PCT Pub. No.: WO2013/069739
PCT Pub. Date: May 16, 2013

(65) Prior Publication Data
US 2014/0312767 A1 Oct. 23, 2014

(30) Foreign Application Priority Data
Nov. 11, 2011 (JP) .................................. 2011-247778

(51) Int. Cl.
H05B 31/26 (2006.01)
H01J 37/32 (2006.01)

(52) U.S. Cl.
CPC .............................. *H01J 37/32238* (2013.01)

(58) Field of Classification Search
CPC ............... H01J 37/3244; H01J 37/321; H01J 37/32192; H01J 37/32238; H01J 37/32449; H01J 37/32119; H01J 37/32201; H01J 37/3222

USPC .......... 315/111.01–111.91, 39, 39.51–39.65; 219/121.43, 121.4, 121.41, 121.42; 118/723 MW, 723 E, 723 ER
See application file for complete search history.

(56) References Cited

U.S. PATENT DOCUMENTS 6,953,908 B2 * 10/2005 Ishii et al. ................. 219/121.43
7,432,468 B2 * 10/2008 Oka et al. .................. 219/121.43
(Continued)

FOREIGN PATENT DOCUMENTS

JP 11-251090 A 9/1999
JP 2007-184259 A 7/2007
(Continued)

OTHER PUBLICATIONS

International Search Report mailed Feb. 12, 2013 in PCT/JP2012/079006.

*Primary Examiner* — Alexander H Taningco
*Assistant Examiner* — Christopher Lo
(74) *Attorney, Agent, or Firm* — Rothwell, Figg, Ernst & Manbeck, P.C.

(57) ABSTRACT

A dielectric window for a plasma treatment device for a plasma treatment device that uses microwaves as a plasma source. The dielectric window is circular-plate-shaped and allows microwaves to propagate. The dielectric window has a recess that has an opening on the lower-surface side and that indents in the plate thickness direction of the dielectric window, and is provided to the lower surface at which plasma is generated when the dielectric window is provided to the plasma treatment device. The recess has a bottom surface extending in the direction perpendicular to the plate thickness direction, and a side surface extending in the plate thickness direction from the circumferential edge of the bottom surface toward the opening of the recess. In addition, an inclined surface extends at an incline relative to the plate thickness direction from the opening-side circumferential edge of the side surface toward the opening of the recess.

10 Claims, 8 Drawing Sheets

(56) References Cited

U.S. PATENT DOCUMENTS

| | | | |
|---|---|---|---|
| 7,930,992 B2* | 4/2011 | Nozawa et al. | 118/723 MW |
| 2003/0173030 A1* | 9/2003 | Ishii et al. | 156/345.48 |
| 2004/0094094 A1* | 5/2004 | Ohmi et al. | 118/723 MW |
| 2009/0211708 A1* | 8/2009 | Matsumoto et al. | 156/345.41 |
| 2011/0000780 A1 | 1/2011 | Tian et al. | |

FOREIGN PATENT DOCUMENTS

| | | |
|---|---|---|
| JP | 2007-220639 A | 8/2007 |
| JP | 2010-34321 A | 2/2010 |
| JP | 2010-258461 A | 11/2010 |
| WO | 2009/101927 A1 | 8/2009 |

\* cited by examiner

DIELECTRIC WINDOW FOR PLASMA TREATMENT DEVICE, AND PLASMA TREATMENT DEVICE

CROSS REFERENCE TO RELATED APPLICATION

This application is a 35 U.S.C. 371 National Phase Entry Application from PCT/JP2012/079006, filed Nov. 8, 2012, which claims priority to Japanese Patent Application No. 2011-247778, filed Nov. 11, 2011, the disclosures of which are incorporated herein in their entirety by reference.

TECHNICAL FIELD

The present disclosure relates to a dielectric window for a plasma treatment device (hereinafter, also simply referred to as "dielectric window") and the plasma treatment device.

BACKGROUND

A semiconductor device such as, for example, a large scale integrated circuit (LSI) or a metal oxide semiconductor (MOS) transistor is manufactured by performing a treatment such as, for example, etching, chemical vapor deposition (CVD), or sputtering on a semiconductor substrate (wafer) as a substrate to be processed. As a treatment such as, for example, etching, CVD, or sputtering, a treatment method using plasma as an energy supply source, that is, for example, plasma etching, plasma CVD, or plasma sputtering, is used.

Here, a technology related to a plasma treatment device for performing a plasma treatment is disclosed in Japanese Patent Laid-Open Publication No. 2007-184259 (Patent Document 1) and International Publication WO2009/101927 (Patent Document 2).

PRIOR ART DOCUMENT

Patent Document

Patent Document 1: Japanese Patent Laid-Open Publication No. 2007-184259
Patent Document 2: International Publication WO2009/101927

DISCLOSURE OF THE INVENTION

Problems to be Solved

According to Patent Document 1, the microwave plasma treatment device includes a ceiling plate provided with a recess on a plasma generation side surface of the ceiling plate, in which the recess absorbs microwaves by resonance at a side thereof such that the microwaves are propagated in a single mode within the recess. Referring to FIGS. 3a, 3b, 6a and 6b of Patent Document 1, the recess may be formed in a cylindrical, hemispherical or conical shape.

According to Patent Document 2, in the plasma generating device, microwaves transferred along a microwave inlet tube are guided into a discharge vessel through a dielectric plate to generate plasma within the discharge vessel. A plurality of hollow holes is formed at the discharge vessel side of the dielectric plate to cause hollow discharge. Referring to FIGS. 2b or 3a and 3b in Patent Document 2, the hollow holes may be formed in a cylindrical shape hollowed out from the discharge vessel side of the dielectric plate, and 3b in Patent Document 2.

Here, in the above described dielectric plate disclosed in Patent Document 1 or Patent Document 2, deviation of plasma generated in the region below the dielectric plate may occur according to processing conditions, especially under a high pressure environment. When such an unevenness of plasma occurs, microwaves may be propagated from a so-called thin region side of the plasma to the periphery of a substrate to be processed ("substrate"). In terms of improving the processing accuracy of the substrate, a phenomenon in which the microwaves are propagated to the periphery of the substrate is not preferable.

An object of the present disclosure is to provide a dielectric window for a plasma treatment device which may improve the uniformity of generated plasma.

Another object of the present disclosure is to provide a plasma treatment device which may improve the uniformity in a substrate treatment.

Means to Solve the Problems

A dielectric window for a plasma treatment device according to the present disclosure is provided in a plasma treatment device using microwaves as a plasma source. The dielectric window for the plasma treatment device ("dielectric window") is formed in a disk shape and configured to propagate the microwaves. A recess is provided on a bottom surface of the dielectric window in which the bottom surface becomes a plasma generation side when the dielectric window is provided in the plasma treatment device, an opening of the recess becomes the bottom surface side, and the recess is recessed inwardly in a plate thickness direction of the dielectric window. The recess is constituted by a base surface which extends in a direction perpendicular to the plate thickness direction of the dielectric window, a side surface which extends in the plate thickness direction of the dielectric window toward the opening side of the recess from a circumferential edge of the base surface, and an inclined surface which extends at an incline with respect to the plate thickness direction of the dielectric window from an opening side circumferential edge of the side surface toward the opening side of the recess.

Through the above described configuration, it is possible to reduce the possibility that a deviation of plasma generated in the region below the dielectric window may occur. Accordingly, the uniformity of the generated plasma may be improved.

A plurality of recesses may be provided in the dielectric window. Thus, the uniformity of the generated plasma may be further improved.

The plurality of recesses may be concentrically provided. Thus, the uniformity of the generated plasma may be further improved in the radial direction.

The plurality of recesses may have a rotational symmetry about a center of the dielectric window when the dielectric window is viewed in the plate thickness direction. Thus, the uniformity of the generated plasma may be further improved in the circumferential direction.

An angle between the bottom surface and the inclined surface may range from 40° to 60° in a cross-sectional view of the dielectric window when cut along a plane which includes the recess and extends in the plate thickness direction of the dielectric window. Thus, the uniformity of the generated plasma may be more securely improved.

The inclined surface may include a curved surface.

According to another aspect of the present disclosure, a plasma treatment device using microwaves as a plasma source includes a dielectric window for a plasma treatment device ("dielectric window") which is formed in a disk shape and configured to propagate the microwaves. A recess is provided on a bottom surface of the dielectric window in which the bottom surface becomes a plasma generation side when the dielectric window is provided in the plasma treatment device, an opening of the recess becomes the bottom surface side, and the recess is recessed inwardly in a plate thickness direction of the dielectric window. The recess is constituted by a base surface which extends in a direction perpendicular to the plate thickness direction of the dielectric window, a side surface which extends in the plate thickness direction of the dielectric window toward the opening side of the recess from a circumferential edge of the base surface, and an inclined surface which extends at an incline with respect to the plate thickness direction of the dielectric window from an opening side circumferential edge of the side surface toward the opening side of the recess.

The plasma treatment device configured as described above includes the dielectric window which may improve the uniformity of generated plasma, and thus the uniformity in a substrate treatment may be improved.

The plasma treatment device further includes a slot antenna plate formed in a disk shape and provided with a plurality of slots penetrating in the plate thickness direction of the slot antenna plate. The slot antenna plate is disposed at a top side of the dielectric window to radiate the microwaves toward the dielectric window.

According to a further aspect of the present disclosure, a dielectric window for a plasma treatment device ("dielectric window") is provided in a plasma treatment device using microwaves as a plasma source. The dielectric window is formed in a disk shape and configured to propagate the microwaves. A recess is provided on a bottom surface of the dielectric window in which the bottom surface becomes a plasma generation side when the dielectric window is provided in the plasma treatment device, an opening of the recess becomes the bottom surface side, and the recess is recessed inwardly in a plate thickness direction of the dielectric window. The recess is constituted by a base surface which extends in a direction perpendicular to the plate thickness direction of the dielectric window, a side surface which extends in the plate thickness direction of the dielectric window toward the opening side of the recess from a circumferential edge of the base surface, and an inclined surface which extends at an incline with respect to the plate thickness direction of the dielectric window from an opening side circumferential edge of the side surface toward the opening side of the recess. At least one of portions between the base surface and the side surface, between the side surface and the inclined surface, and between the inclined surface and the bottom surface is joined by a curved surface.

According to a still further aspect of the present disclosure, a dielectric window for a plasma treatment device ("dielectric window") is provided in a plasma treatment device using microwaves as a plasma source. The dielectric window is formed in a disk shape and configured to propagate the microwaves. A recess is provided on a bottom surface of the dielectric window in which the bottom surface becomes a plasma generation side when the dielectric window is provided in the plasma treatment device, an opening of the recess becomes the bottom surface side, and the recess is recessed inwardly in a plate thickness direction of the dielectric window. The recess is constituted by a base surface which extends in a direction perpendicular to the plate thickness direction of the dielectric window, a side surface which extends in the plate thickness direction of the dielectric window toward the opening side of the recess from a circumferential edge of the base surface, and an inclined surface which extends at an incline with respect to the plate thickness direction of the dielectric window from an opening side circumferential edge of the side surface toward the opening side of the recess. The recess is recessed in the form of an elongated hole.

Effect of the Invention

When a dielectric window for a plasma treatment device is configured as described above, it is possible to reduce the possibility that the deviation of plasma generated in the region below the dielectric window may occur. Accordingly, the uniformity of the generated plasma may be improved.

In addition, such a plasma treatment device is provided with a dielectric window for the plasma treatment device which may improve the uniformity of generated plasma. Thus, the uniformity in a substrate treatment may be improved.

DETAILED DESCRIPTION TO EXECUTE THE INVENTION

Figure 1:
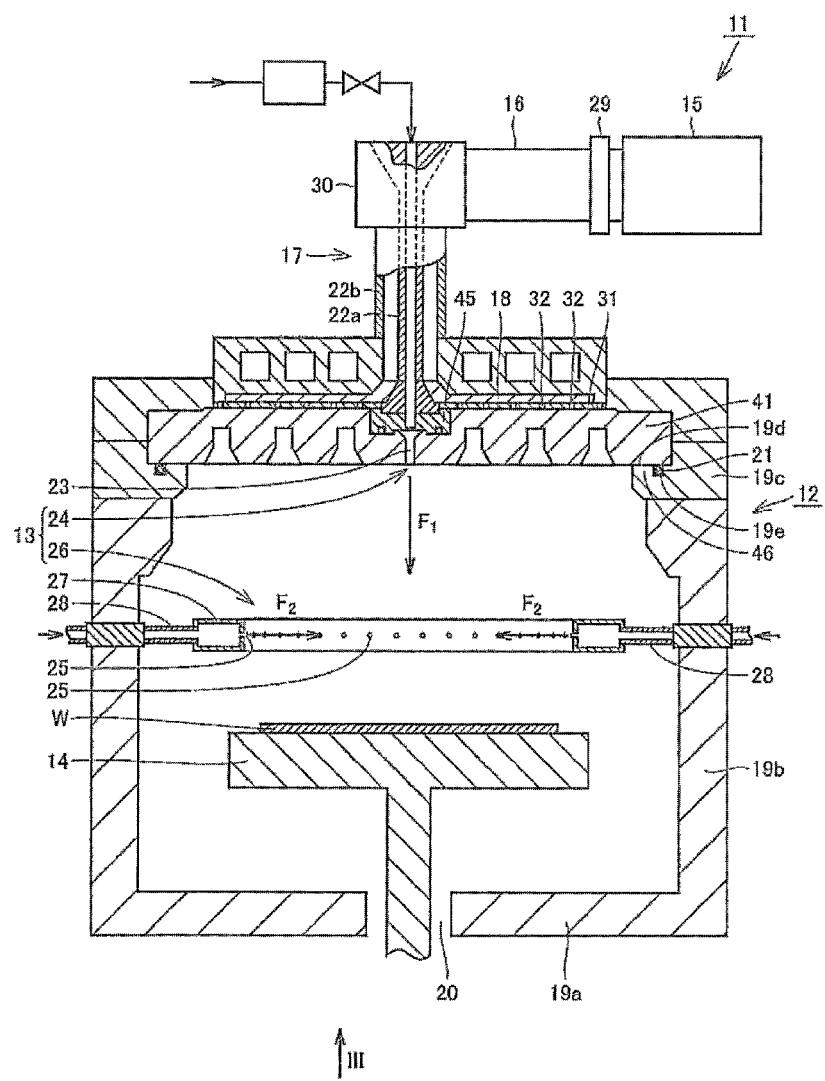
FIG. 1 is a schematic cross-sectional view schematically illustrating a configuration of a plasma treatment device provided with a dielectric window for the plasma treatment device according to an exemplary embodiment of the present disclosure.
Figure 2:
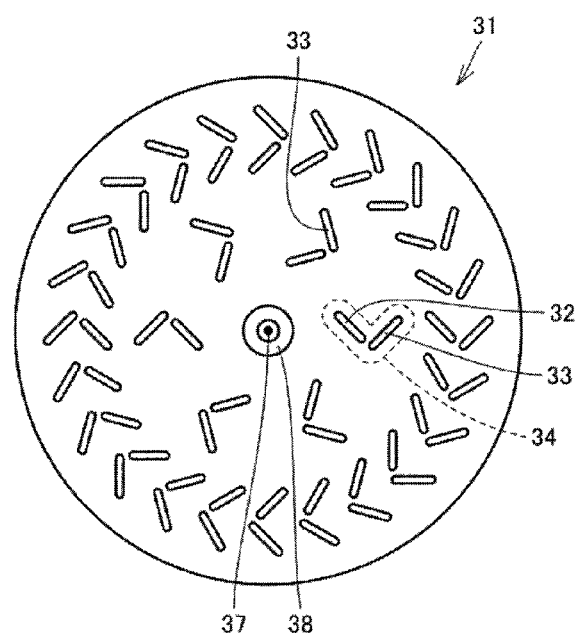
FIG. 2 is a view illustrating a slot antenna plate provided in the plasma treatment device according to the exemplary embodiment of the present disclosure, when viewed in a plate thickness direction.
Figure 3:
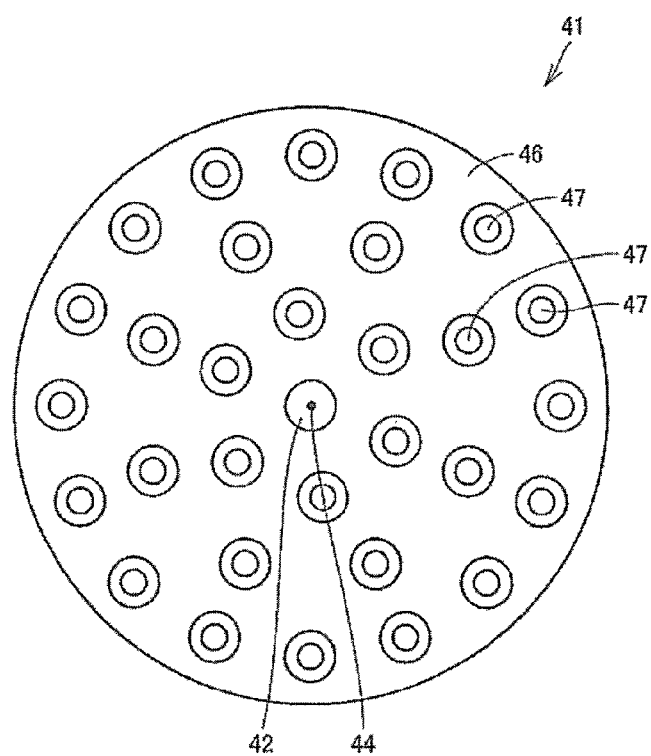
FIG. 3 is a view illustrating a dielectric window for the plasma treatment device according to the exemplary embodiment of the present disclosure, when viewed in a plate thickness direction.
Figure 4:
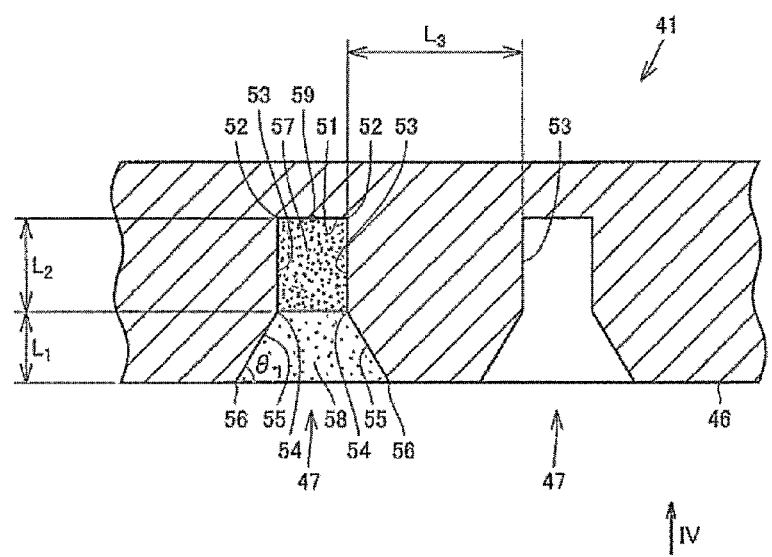
FIG. 4 is a cross-sectional view illustrating a part of the dielectric window for the plasma treatment device according to the exemplary embodiment of the present disclosure, when cut along a plane which includes a recess and extends in a plate thickness direction of the dielectric window for the plasma treatment device.

Hereinafter, exemplary embodiments of the present disclosure will be described with reference to drawings. First, descriptions will be made on a configuration of a plasma treatment device according to an exemplary embodiment of the present disclosure. FIG. 1 is a schematic cross-sectional view schematically illustrating a configuration of a plasma treatment device provided with a dielectric window for the plasma treatment device according to an exemplary embodiment of the present disclosure. FIG. 2 is a view of a slot antenna plate provided in the plasma treatment device illustrated in FIG. 1, when viewed in a thickness direction of the plate. FIG. 3 is a view of a dielectric window for the plasma treatment device according to the exemplary embodiment of the present disclosure, when viewed in a thickness direction of the plate. FIG. 4 is a cross-sectional view illustrating a part of the dielectric window for the plasma treatment device according to the exemplary embodiment of the present disclosure, when cut along a plane which includes a recess to be described later and extends in the plate thickness direction of the dielectric window for the plasma treatment device. Also, FIG. 1 corresponds to a cross-sectional view of the dielectric window for the plasma treatment device, when cut along a plane which extends in the plate thickness direction. FIG. 3 corresponds to a view illustrating the dielectric window for the plasma treatment device, when viewed from the bottom side, that is, in the direction of arrow III of FIG. 1.

Referring to FIGS. 1 to 4, a plasma treatment device 11 according to an exemplary embodiment of the present disclosure is a microwave plasma treatment device using microwaves as a plasma source. The plasma treatment device 11 includes: a processing container 12 including a processing space configured to perform a plasma treatment on a substrate W therein; a gas supply unit 13 configured to supply, for example, a gas for the plasma treatment into the processing container 12; a supporting unit 14 provided within the processing container 12 and configured to support the substrate W mounted thereon; a microwave generator 15 installed outside of the processing container 12 to generate microwaves for plasma excitation; a waveguide 16 and a coaxial waveguide 17 configured to introduce the microwaves generated by the microwave generator 15 into the processing container 12; a dielectric member 18 connected to a lower end portion of the coaxial waveguide 17 to propagate radially the microwaves introduced by the coaxial waveguide 17; a slot antenna plate 31 disposed below the dielectric member 18, and having a plurality of slots 32 configured to radiate the microwaves propagated by the dielectric member 18; a dielectric window 41 disposed below the slot antenna plate 31, and configured to propagate radially the microwaves radiated from the slots 32 so as to transmit the microwaves into the processing container 12; and a control unit (not illustrated) configured to control the whole of the plasma treatment device 11. The control unit controls process conditions for a plasma treatment on the substrate W such as, for example, a gas flow rate in the gas supply unit 13, and a pressure within the processing container 12. In terms of easy understanding, FIG. 1 schematically illustrates an opening shape of the slots 32.

The processing container 12 includes a bottom portion 19a positioned below the supporting unit 14, a side wall 19b which extends upwardly from the outer circumference of the bottom portion 19a, and an annular member 19c disposed to be mounted on the top side of the side wall 19b, on which the dielectric window 41 may be mounted. The side wall 19b is cylindrical. An exhaust hole 20 for exhaustion is formed at the central portion in the radial direction of the bottom portion 19a of the processing container 12. The top side of the processing container 12 is opened, and the processing container 12 is configured to be sealed by the dielectric window 41 mounted on an end surface 19d and disposed at the top side of the processing container 12, and an O-ring 21 as a sealing member. The O-ring 21 is fitted between the dielectric window 41 and the processing container 12, specifically, in an O-ring receiving recess 19e to be interposed between the dielectric window 41 and the annular member 19c which constitutes the processing container 12.

A high frequency power source for RF (radio frequency) bias is electrically connected to the supporting unit 14 through a matching unit and a power feeding rod (both not illustrated). The high frequency power source outputs high frequency waves of a predetermined frequency (e.g., 13.56 MHz) suitable for controlling the energy of ions drawn into the substrate W with a predetermined power. The matching unit accommodates a matching device configured to match the impedance at the high frequency power source side with the impedance at the load side mainly such as, for example, the electrode, the plasma, and the processing container 12, and a blocking condenser configured to generate self-bias is included in the matching device.

The gas supply unit 13 includes a center gas supply unit 24 having a gas supply hole 23 configured to supply a gas toward the center of the substrate W, and an outer gas supply unit 26 constituted by an annular hollow member 27, and formed with gas supply holes 25 configured to supply a gas radially inward.

The gas supply hole 23 of the center gas supply unit 24 is formed to be opened at the central area in the radial direction of the disk-shaped dielectric window 41. The center gas supply unit 24 employs a hollow portion of a hollow central conductor 22a which constitutes the coaxial waveguide 17, as a supply path of a gas. The center gas supply unit 24 includes an injector unit 45 accommodated in the dielectric window 41 and configured to supply a gas into the processing container 12 by injecting the gas.

The hollow member 27 which constitutes the outer gas supply unit 26 is supported by a plurality of supporting members 28 which extends straight radially from the inner wall surface of the side wall 19b, within the processing container 12. The inner diameter of the hollow member 27 is set to be slightly larger than the outer diameter of the substrate W. The hollow portion of the hollow member 27 is configured to have a substantially rectangular cross section. The hollow member 27 is disposed to avoid the region just above the substrate W, above the supporting unit 14. The gas supply holes 25 of the outer gas supply unit 26 are formed in plural numbers to be opened in round hole shapes at the inner wall surface of the annular hollow member 27. The plurality of gas supply holes 25 is formed to be spaced apart from each other at predetermined intervals such that the gas supply holes are substantially evenly distributed.

Each of the center gas supply unit 24 and the outer gas supply unit 26 supplies, for example, a gas for plasma treatment into the processing container 12 from the outside of the processing container 12. The flow directions of gases supplied from the gas supply holes 23 and 25 are indicated by arrows $F_1$ and $F_2$ in FIG. 1, respectively. The flow rate ratio and types of gases supplied from the center gas supply unit 24 and the outer gas supply unit 26 may be optionally selected. For example, different types of gases may be separately supplied from the center gas supply unit 24 and the outer gas supply unit 26. Of course, no gas may be supplied from the center gas supply unit 24, and a gas may be supplied only from the outer gas supply unit 26 into the processing container 12. Since the gas supply unit 13 is configured to include the center gas supply unit 24 and the outer gas supply unit 26 as described above, the uniformity of treatment may be finely adjusted in the radial direction. Specifically, for example, when a treatment at an edge area of a substrate W is less sufficient than a treatment at a central area of the substrate W, the flow rate ratio of a gas supplied from the outer gas supply unit 26 is increased in flow rate ratios of the center gas supply unit 24 and the outer gas supply unit 26 so as to facilitate the plasma treatment of the edge area. Then, it is possible to finely adjust the uniformity of treatment.

The microwave generator 15 including the matching unit 29 is connected to the upstream side of the waveguide 16 configured to introduce the microwaves through the coaxial waveguide 17 that is constituted by the central conductor 22a and an outer conductor 22b, and a mode converter 30. The central conductor 22a and the outer conductor 22b which constitute the coaxial waveguide 17 are both formed in cylindrical shapes and disposed to be extend vertically in the drawing of FIG. 1 such that their radial centers correspond to each other and the outer diameter surface of the central conductor 22a and the inner diameter surface of the outer conductor 22b are spaced apart from each other. For example, TE-mode microwaves generated by the microwave generator 15 pass through the waveguide 16, are converted into TEM-mode microwaves by the mode converter 30, and propagate through the coaxial waveguide 17. As the frequency of the microwaves generated by the microwave generator 15, for example, 2.45 GHz is selected.

Hereinafter, a specific configuration of the slot antenna plate 31 will be described. The slot antenna plate 31 is formed in a thin disk shape. Both surfaces in the plate thickness direction of the slot antenna plate 31 are flat. A plurality of slots 32 and 33 is provided in the slot antenna plate 31 to penetrate the slot antenna plate 31 in the plate thickness direction. The slots 32 and 33 are formed such that a first slot 32 which is long in one direction and a second slot 33 which is long in a direction perpendicular to the first slot 32 are adjacent to be paired. Specifically, in the configuration, two adjacent slots 32 and 33 are paired to be disposed in a substantially inverted V shape. That is, the slot antenna plate 31 is configured to have slot pairs 34 each of which is constituted by the first slot 32 which extends in one direction and the second slot 33 which extends in a direction perpendicular to the one direction. One example of such a slot pair 34 is illustrated in the region indicated by the dotted line of FIG. 2.

A through hole 37 is formed at the center in the radial direction of the slot antenna plate 31. The slot antenna plate 31 has a rotational symmetry about a center 38 in the radial direction.

The microwaves generated by the microwave generator 15 are propagated to the dielectric member 18 through the coaxial waveguide 17, and are radiated to the dielectric window 41 from the plurality of slots 32 and 33 provided in the slot antenna plate 31. The microwaves, which have been transmitted through the dielectric window 41, generate an electric field just below the dielectric window 41, and generate plasma within the processing container 12. The plasma generated just below the dielectric window 41 is gradually diffused in a direction away from the dielectric window 41, that is, in a direction toward the supporting unit 14. In a plasma diffusion region which is formed by the diffused plasma and includes a substrate mounted on the supporting unit 14, a plasma treatment such as, for example, plasma etching is performed on the substrate W. Microwave plasma provided for the treatment in the plasma treatment device 11 is generated by the radial line slot antenna which includes the slot antenna plate 31 configured as described above and the dielectric window 41.

Hereinafter, the configuration of the dielectric window 41 according to an exemplary embodiment of the present disclosure will be described in detail. The dielectric window 41 according to the exemplary embodiment of the present disclosure is substantially disk-shaped, and has a predetermined plate thickness. The dielectric window 41 is made of a dielectric substance, and a specific material for the dielectric window 41 may be, for example, quartz or alumina. The dielectric window 41 is attached to the plasma treatment device 11 such that the bottom side in FIG. 3 is placed on the annular member 19c which constitutes a part of the side wall 19b of the processing container 12.

A through hole 42 is formed at the center in the radial direction of the dielectric window 41 to penetrate in the plate thickness direction, that is, the vertical direction of the drawing in FIG. 3. A lower area of the through hole 42 becomes the gas supply hole 23 of the center gas supply unit 24, and an upper area becomes a receiving recess 43 configured to receive the injector unit 45 which constitutes the center gas supply unit 24. The center in the radial direction of the dielectric window 41 is indicated by a center 44.

Here, a recess 47 is formed on the bottom surface 46 of the dielectric window 41 in which the bottom surface 46 becomes a plasma generation side when the dielectric window 41 is provided in the plasma treatment device 11. The recess 47 is opened at the bottom surface 46 side and recessed inwardly in the plate thickness direction of the dielectric window 41. A plurality of recesses 47 is provided to be spaced apart from each other at a predetermined interval. In the present exemplary embodiment, thirty (30) recesses 47 are provided. Specifically, for example, as the predetermined interval, in a case of quartz as a material for the dielectric window 41, since the wavelength is about 60 mm, about 30 mm which is about a half of the wavelength is employed, and in a case of alumina as a material for the dielectric window 41, since the wavelength is about 40 mm, about 20 mm which is about a half of the wavelength is employed. The interval mentioned herein indicates an interval between side surfaces 53 to be described later in the adjacent recesses 47 and is a length indicated by the length $L_3$ in FIG. 4.

The plurality of recesses 47 is concentrically provided. Specifically, the plurality of recesses 47 is constituted by a group of six (6) concentric recesses 47 located at the innermost diameter side, a group of eight (8) concentric recesses 47 located at the outer diameter side of the group of six (6) recesses 47, and a group of sixteen (16) concentric recesses 47 located at the outer diameter side of the group of eight (8) concentric recesses 47. The plurality of recesses 47 has a rotational symmetry about the center 44 of the dielectric window 41 when the dielectric window 41 is viewed in the plate thickness direction, that is, from the bottom surface 46 side in this case. That is, the dielectric window 41 provided with the plurality of recesses 47 is formed in a shape having a rotational symmetry when viewed from the bottom surface 46, and has the same shape when rotated at a predetermined angle besides 360° about the center 44 of the dielectric window 41. An area of the bottom surface 46 not provided with the recesses 47 is constituted by a flat surface, that is a surface extending in a direction perpendicular to the plate thickness direction of the dielectric window 41.

Hereinafter, the shape of the recess 47 will be described. The recess 47, as described above, has a shape recessed inwardly in the plate thickness direction of the dielectric window from the bottom surface 46 of the dielectric window 41, specifically in the direction of arrow IV illustrated in FIG. 4.

The recess 47 is constituted by a base surface 51 which extends in a direction perpendicular to the plate thickness direction of the dielectric window 41, a side surface 53 which extends in the plate thickness direction of the dielectric window 41 toward the opening side of the recess 47 from the circumferential edge 52 of the base surface 51, and an inclined surface 55 which extends at an incline with respect to the plate thickness direction of the dielectric window 41 from the opening side circumferential edge 54 of the side surface 53 toward the opening side of the recess 47. The base surface 51 forms a circular surface, and the side surface 53 forms a cylindrical outer surface. The inclined surface 55 forms a part of a conical outer surface. The opening side circumferential edge 56 of the inclined surface 55 is located at the bottom surface 46. The inclined surface 55 is provided such that the opening is widened from the base surface 51 and the side surface 53 side. The base surface 51 is indicated by a line which extends straight in the horizontal direction of the drawing in FIG. 4, and the side surface 53 is indicated by two lines which extend straight in the vertical direction of the drawing in FIG. 4. The inclined surface 55 is indicated by two lines which extend straight to be inclined in FIG. 4. FIG. 4 illustrates a case when cut along a plane which passes through the center of the base surface 51, in which the recess 47 has a shape which is bilaterally symmetrical about a center 59 of the base surface 51 as illustrated in FIG. 4. The length $L_1$ in the plate thickness direction from the bottom surface 46 to the circumferential edge 54 as a boundary between the inclined surface 55 and the side surface 53 is substantially the same as the length $L_2$ in the plate thickness direction from the circumferential edge 54 to the circumferential edge 52 as a boundary between the base surface 51 and the side surface 53. As for the plate thickness of the dielectric window 41, for example, 50 mm may be employed. The angle $\theta_1$ formed between the bottom surface 46 and the inclined surface 55 is 60° in the present exemplary embodiment. These may be equally applied to the shapes of other recesses 47, and the descriptions thereof will be omitted.

Through the above described configuration, it is possible to reduce the possibility that a deviation of plasma generated in the region below the dielectric window 41 may occur. Accordingly, the uniformity of the generated plasma may be improved. Through the plasma treatment device 11 provided with the dielectric window 41 as descried above, the uniformity of a treatment on a substrate W may be improved.

Here, since a plurality of recesses is provided, the uniformity of the generated plasma may be further improved.

Since the plurality of recesses is concentrically provided, the uniformity of the generated plasma may be further improved in the radial direction.

Since the plurality of provided recesses is configured to have a rotational symmetry about the center of the dielectric window for the plasma treatment device when the dielectric window for the plasma treatment device is viewed in the plate thickness direction, the uniformity of the generated plasma may be further improved in the circumferential direction.

It is believed that the possibility that a deviation of plasma may occur may be reduced by a mechanism described as follows. That is, for example, under a high pressure condition, microwaves of a high energy may be introduced to increase the density of generated plasma in terms of shortening a treatment time. Under such a circumstance, a cylindrical region 57 surrounded by the base surface 51 and the side surface 53 becomes a space which generates strong plasma because a resonance absorption of the microwaves occurs mainly within the region 57. A truncated cone-shaped region 58 surrounded by the opening side inclined surface 55 of the region 57 becomes a space in which re-absorption of the microwaves which are not absorbed in the region 57 surrounded by the base surface 51 and the side surface 53 or reflection of the microwaves by the inclined surface 55 is performed. The reflection of the microwaves by the inclined surface 55 inhibits occurrence of a strong standing wave in a direction perpendicular to the plate thickness direction, that is, in the horizontal direction of the drawing in FIG. 4, especially a strong standing wave in the vicinity of the bottom surface 46 of the dielectric window 41. It is thought that by forming the inclined surface 55 and the space of the region 58 surrounded by and the inclined surface 55, microwaves are suppressed from being leaked into the processing container 12 due to the deviation and unevenness of the plasma generated in the region below the dielectric window 41.

Figure 5:
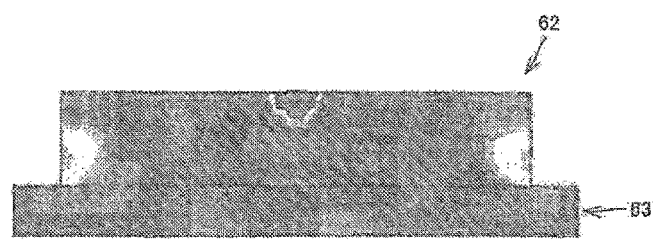
FIG. 5 illustrates a simulation result which indicates the distribution of electric field strengths in a dielectric window for a plasma treatment device when microwaves are introduced, in which the dielectric window has a flat bottom surface and is not provided with a recess.
Figure 6:
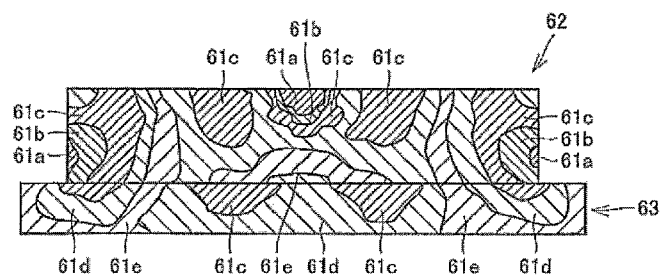
FIG. 6 is a view illustrating the simulation result illustrated in FIG. 5, in which each predetermined area is divided.
Figure 7:
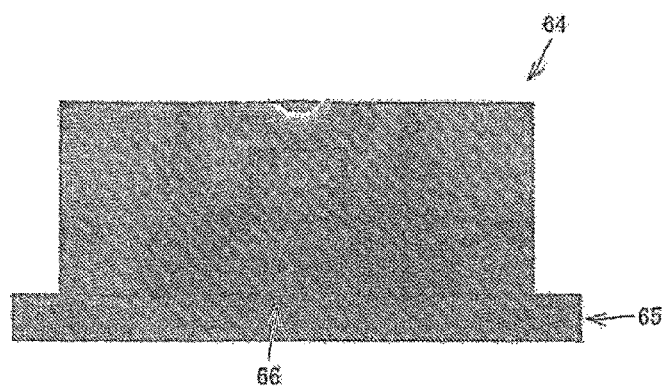
FIG. 7 illustrates a simulation result which indicates the distribution of electric field strengths in a dielectric window for a plasma treatment device according to the exemplary embodiment of the present disclosure when microwaves are introduced.
Figure 8:
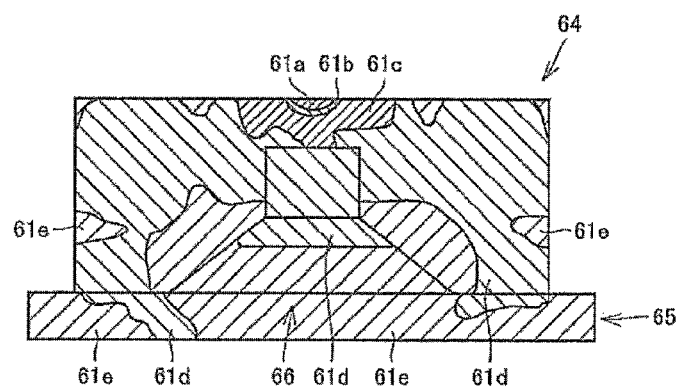
FIG. 8 is a view illustrating the simulation result illustrated in FIG. 7, in which each predetermined area is divided.

Here, descriptions will be made on distributions of electric field strengths in simulation when microwaves are introduced in a dielectric window which has a flat bottom surface and is not provided with a recess, and in a dielectric window according to an exemplary embodiment of the present disclosure, for example, the dielectric window illustrated in FIG. 3. FIG. 5 illustrates a simulation result in a dielectric window for a plasma treatment device which indicates a distribution of electric field strengths when the dielectric window has the flat bottom surface and is not provided with the recess and microwaves are introduced in the dielectric window. FIG. 6 is a view illustrating the simulation result illustrated in FIG. 5 for each of subdivided predetermined areas. FIG. 7 illustrates a simulation result which indicates a distribution of electric field strengths when microwaves are introduced in a dielectric window for a plasma treatment device according to an exemplary embodiment of the present disclosure. FIG. 8 is a view illustrating a simulation result illustrated in FIG. 7 for each of subdivided predetermined areas. FIGS. 6 and 8 illustrate the simulation results illustrated in FIGS. 5 and 7, respectively, in the areas roughly subdivided based on five levels of electric field strengths. The areas 61a exhibit the highest electric field strength, the electric field strengths of the areas indicated by 61b, 61c, and 61d are sequentially decreased in the order of areas 61b, 61c, and 61d, and the areas 61e exhibit the lowest electric field strength. FIG. 5 illustrates a dielectric window 62 and a space 63 just below the dielectric window 62. FIG. 7 illustrates a dielectric window 64 provided with a recess 66, according to an exemplary embodiment of the present disclosure, and a space 65 just below the dielectric window 64.

Referring to FIGS. 5 to 8, in the dielectric window 62 which has a flat bottom surface and is not provided with a recess, a plurality of high electric field strength areas occurs within the dielectric window 62, and some strong electric field strength areas extend to the space 63 just below the dielectric window 62. However, in the dielectric window 64 provided with the recess 66 according to an exemplary embodiment of the present disclosure, high electric field strength areas are concentrated at the top side of the position where the recess 66 is provided, and in other areas within the dielectric window 64, the electric field strength is relatively decreased. In the space 65 just below the dielectric window 64, few areas have a high electric field strength.

As described above, according to the dielectric window for the plasma treatment device which is configured as described above, it is possible to reduce the possibility that a deviation of plasma generated in the region below the dielectric window may occur. Accordingly, the uniformity of the generated plasma may be improved.

Figure 9:
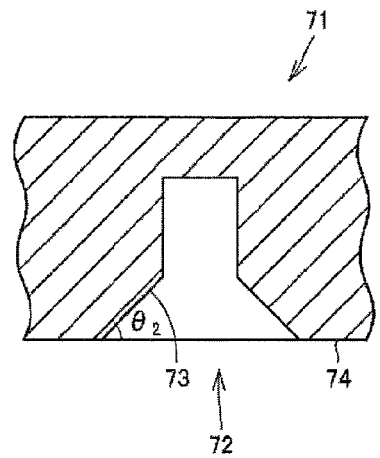
FIG. 9 is a cross-sectional view illustrating a dielectric window for a plasma treatment device according to another exemplary embodiment of the present disclosure, when cut along a plane which includes a recess and extends in a plate thickness direction of the dielectric window for the plasma treatment device.

In the above described exemplary embodiment, the angle formed between the bottom surface and the inclined surface is set as 60°, but the present disclosure is not limited thereto. For example, as for the angle formed between the bottom surface and the inclined surface, an angle ranging from 40° to 60° may be employed. FIG. 9 illustrates a case according to another exemplary embodiment of the present disclosure in which the angle formed between the bottom surface and the inclined surface is set as 45°. Referring to FIG. 9, the angle $\theta_2$ formed between an inclined surface 73 which constitutes a recess 72 of a dielectric window 71, and a bottom surface 74 is 45°. Through this configuration, the uniformity of the generated plasma may be more securely improved.

In the above described exemplary embodiment, the inclined surface extends straight at an incline with respect to the bottom surface, but the present disclosure is not limited thereto. In another configuration, the inclined surface may be curved rather than extending straight at an incline with respect to the bottom surface. That is, in the cross-section illustrated in, for example, FIG. 4, the line indicating the inclined surface may be considered as being composed of a smoothly curved line having a predetermined curvature. Further, the line may be considered as being composed of a line extending straight at an incline and a smoothly curved line.

Figure 10:
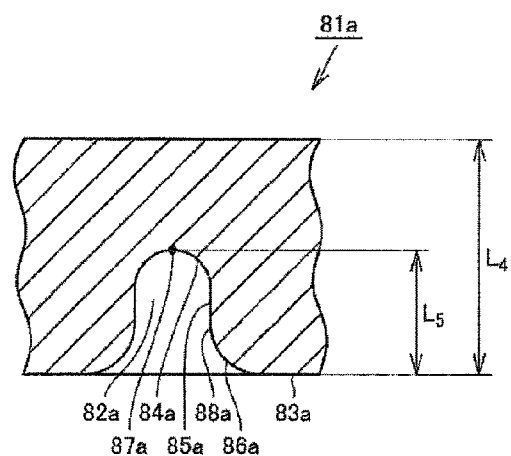
FIG. 10 is a cross-sectional view illustrating a part of a dielectric window for a plasma treatment device according to another exemplary embodiment of the present disclosure, when cut along a plane which includes a recess and extends in a plate thickness direction of the dielectric window for the plasma treatment device.

In the exemplary embodiments illustrated in FIGS. 4 and 9, the inclined surface is constituted by lines which extend straight at an incline, but the present disclosure is not limited thereto. The inclined surface may be formed in a so-called R-plane shape. Further, a curved surface may be formed at a continuous portion between the inclined surface and another surface. Further, a base surface and a side surface may be configured to be joined to each other through a curved surface. FIG. 10 is a cross-sectional view illustrating a part of a dielectric window for a plasma treatment device in such a case, when cut along a plane which includes a recess and extends in the plate thickness direction of the dielectric window for the plasma treatment device. FIG. 10 is a view corresponding to FIGS. 4 and 9. Referring to FIG. 10, as described above, a recess 82a provided in a dielectric window 81a for a plasma treatment device, according to another exemplary embodiment of the present disclosure, has a shape recessed inwardly in the plate thickness direction of the dielectric window 81a from a bottom surface 83a of the dielectric window 81a.

The recess 82a is constituted by a semispherical base surface 84a, a side surface 85a which extends in the plate thickness direction of the dielectric window 81a, and an inclined surface 86a of an R-plane shape which extends at an incline with respect to the plate thickness direction of the dielectric window 81a from the opening side of the side surface 85a toward the opening side of the recess 82a. The base surface 84a is formed in a semispherical shape which centers on a top portion 87a. The top portion 87a in the semispherical shape is located at the innermost side of the dielectric window 81a. The side surface 85a forms a cylindrical outer surface. The inclined surface 86a is formed in a shape joined to an opening side edge 88a of the side surface 85a through a curved surface. The inclined surface 86a is formed in a shape joined to the bottom surface 83a through a curved surface. That is, the inclined surface 86a is configured to be smoothly joined to the side surface 85a and the bottom surface 83a. This configuration may be employed.

In the above described configuration, since the surfaces constituting the recess 82a do not have a so-called corner portion the possibility of local electric field concentration on the corner portion may be reduced. This may prolong, for example, the lifetime of the dielectric window 81a. As a specific dimension, the length in the plate thickness direction of the recess 82a from the bottom surface 83a to the top portion 87a, which is indicated by the length $L_5$ in FIG. 10, may be selected as 15 mm when the plate thickness of the dielectric window 81a indicated by the length $L_4$ in FIG. 10 is 30 mm. For the semispherical base surface 84a, R 15 mm is selected, and for the curved inclined surface 86a, R 7.5 mm is selected. Other shapes of the recess 82a are the same as those of the recesses 47, and descriptions thereof will be omitted.

Figure 11:
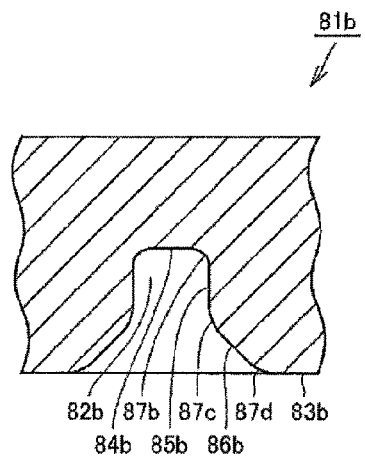
FIG. 11 is a cross-sectional view illustrating a part of a dielectric window for a plasma treatment device according to another exemplary embodiment of the present disclosure, when cut along a plane which includes a recess and extends in a plate thickness direction of the dielectric window for the plasma treatment device.

The shapes of the recess may be configured as described below. FIG. 11 is a cross-sectional view illustrating a part of a dielectric window 81b for a plasma treatment device, according to another exemplary embodiment of the present disclosure, when cut along a plane which includes a recess and extends in the plate thickness direction of the dielectric window for the plasma treatment device. FIG. 11 is a view corresponding to FIGS. 4, 9 and 10. Referring to FIG. 11, as described above, a recess 82b provided in a dielectric window 81b for a plasma treatment device, according to another exemplary embodiment of the present disclosure, has a shape recessed inwardly in the plate thickness direction of the dielectric window 81b from a bottom surface 83b of the dielectric window 81b.

The recess 82b is constituted by a base surface 84b which extends in a direction perpendicular to the plate thickness direction of the dielectric window 81b, a side surface 85b which extends in the plate thickness direction of the dielectric window 81b toward the opening side of the recess 82b from the opening side circumferential edge of the base surface 84b, and an inclined surface 86b which extends at an incline with respect to the plate thickness direction of the dielectric window 81b from the opening side circumferential edge of the side surface 85b toward the opening side of the recess 82b. The base surface 84b forms a circular surface, and the side surface 85b forms a cylindrical outer surface. The inclined surface 86b forms a part of a conical outer surface.

Here, at the circumferential edge of the base surface 84b, the base surface 84b and the side surface 85b are configured to be joined to each other through a curved surface 87b. At the opening side circumferential edge of the side surface 85b, the side surface 85b and the inclined surface 86b are configured to be joined to each other through a curved surface 87c. At the opening side circumferential edge of the inclined surface 86b, the inclined surface 86b and the bottom surface 83b are configured to be joined to each other through a curved surface 87d. That is, all surfaces from the base surface 84b to the bottom surface 83b through the side surface 85b and the inclined surface 86b which form the recess 82b are configured to be smoothly joined to each other. Other shapes of the recess 82b are the same as those of the recesses 47, and descriptions thereof will be omitted. This configuration may be employed. In the above described configuration, the recess 82b does not have a so-called corner portion. Thus, the possibility of local electric field concentration on the corner portion may be reduced. This may prolongs, for example, the lifetime of the dielectric window 81b.

In the above described exemplary embodiment, all the portions between the base surface and the side surface, between the side surface and the inclined surface, and between the inclined surface and the bottom surface are configured to be joined by curved surfaces, but the present disclosure is not limited thereto. At least one of the portions between the base surface and the side surface, between the side surface and the inclined surface, and between the inclined surface and the bottom surface may be configured to be joined by a curved surface.

That is, according to another aspect of the present disclosure, a dielectric window for a plasma treatment device is provided in the plasma treatment device using microwaves as a plasma source, is formed in a disk shape, and propagates the microwaves. A recess is provided on a bottom surface of the dielectric window for the plasma treatment device which becomes a plasma generation side when the dielectric window is provided in the plasma treatment device, in which the opening of the recess becomes the bottom surface side and the recess is recessed inwardly in the plate thickness direction of the dielectric window for the plasma treatment device. The recess is constituted by a base surface which extends in a direction perpendicular to the plate thickness direction of the dielectric window for the plasma treatment device, a side surface which extends in the plate thickness direction of the dielectric window for the plasma treatment device toward the opening side of the recess from the circumferential edge of the base surface, and an inclined surface which extends at an incline with respect to the plate thickness direction of the dielectric window for the plasma treatment device from the opening side circumferential edge of the side surface toward the opening side of the recess. At least one of the portions between the base surface and the side surface, between the side surface and the inclined surface, and between the inclined surface and the bottom surface is joined by a curved surface.

In the above described exemplary embodiment, the shape of the recess is bilaterally symmetrical, but the present disclosure is not limited thereto. A bilaterally asymmetrical shape may be employed. According to required conditions or performances, recesses may not be concentrically provided and may not have a rotational symmetry.

Figure 12:
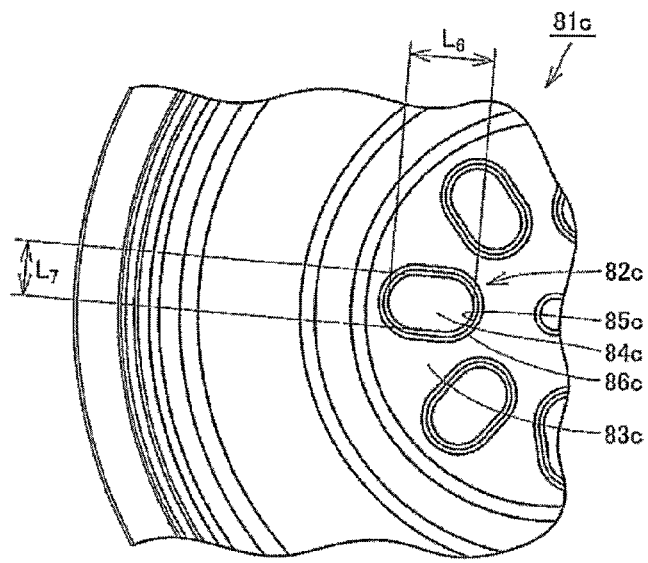
FIG. 12 is a view illustrating a part of a dielectric window for a plasma treatment device according to another exemplary embodiment of the present disclosure, when viewed from a bottom surface side.

Specifically, for example, as a shape of a recess, a shape recessed in the form of an elongated hole may be selected. FIG. 12 is a view illustrating a part of a dielectric window 81c in such a case, when viewed from the bottom surface side. Referring to FIG. 12, a recess 82c is provided on a bottom surface 83c of the dielectric window 81c for the plasma treatment device according to another exemplary embodiment of the present disclosure in which the bottom surface 83c becomes the plasma generation side when the dielectric window 81c is provided in the plasma treatment device, the opening of the recess 82c becomes the bottom surface 83c side and the recess 82c is recessed inwardly in the plate thickness direction of the dielectric window 81c.

The recess 82c is constituted by a base surface 84c which extends in a direction perpendicular to the plate thickness direction of the dielectric window 81c, a side surface 85c which extends in the plate thickness direction of the dielectric window 81c toward the opening side of the recess 82c from the circumferential edge of the base surface 84c, and an inclined surface 86c which extends at an incline with respect to the plate thickness direction of the dielectric window 81c from the opening side circumferential edge of the side surface 85c toward the opening side of the recess 82c. The base surface 84c forms an elongated hole-shaped surface having a long diameter indicated by the length $L_6$ in FIG. 12, and a short diameter indicated by the length $L_7$ in FIG. 12, and the side surface 85c forms an outer surface of a laterally long cylinder. The inclined surface 86c forms a part of an outer surface of a laterally long cone. The opening side circumferential edge of the inclined surface 86c is located at the bottom surface 83c. The inclined surface 86c is provided such that the opening is widened from the base surface 84c and the side surface 85c side. The recess 82c is provided such that its longitudinal direction is located radially. A plurality of recesses 82c is provided to be spaced apart from each other at a predetermined interval in the circumferential direction. Other shapes of the recess 82c are the same as those of the recesses 47, and descriptions thereof will be omitted.

Figure 13:
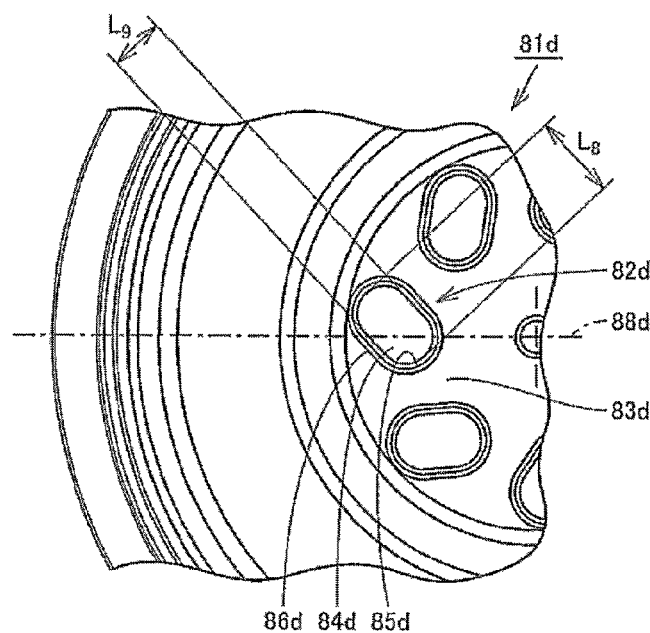
FIG. 13 is a view illustrating a part of a dielectric window for a plasma treatment device according to another exemplary embodiment of the present disclosure, when viewed from a bottom surface side.

The configuration as described below may be employed. FIG. 13 is a view illustrating a part of a dielectric window 81d in such a case, when viewed from the bottom surface side. Referring to FIG. 13, a recess 82d is provided on a bottom surface 83d of the dielectric window 81d for the plasma treatment device according to another exemplary embodiment of the present disclosure in which the bottom surface 83d becomes a plasma generation side when the dielectric window 81d is provided in the plasma treatment device, the opening of the recess 82d becomes the bottom surface 83d side, and the recess 82d is recessed inwardly in the plate thickness direction of the dielectric window 81d.

The recess 82d is constituted by a base surface 84d which extends in a direction perpendicular to the plate thickness direction of the dielectric window 81d, a side surface 85d which extends in the plate thickness direction of the dielectric window 81d toward the opening side of the recess 82d from the circumferential edge of the base surface 84d, and an inclined surface 86d which extends at an incline with respect to the plate thickness direction of the dielectric window 81d from the opening side circumferential edge of the side surface 85d toward the opening side of the recess 82d. The base surface 84d forms an elongated hole-shaped surface having a long diameter indicated by the length $L_8$ in FIG. 13, and a short diameter indicated by the length $L_9$ in FIG. 13, and the side surface 85d forms an outer surface of a laterally long cylinder. The inclined surface 86d forms a part of an outer surface of a laterally long cone. The opening side circumferential edge of the inclined surface 86d is located at the bottom surface 83d. The inclined surface 86d is provided such that the opening is widened from the base surface 84d and the side surface 85d side.

The recess 82d is provided such that the longitudinal direction is located to be inclined toward a radially extending virtual line 88d indicated by an alternated long and short dash line in FIG. 13. A plurality of recesses 82d is provided to be spaced apart from each other at a predetermined interval in the circumferential direction. The plurality of recesses 82d is provided to be inclined in the same direction. As to the inclined angle, when the slot antenna is disposed in the plate thickness direction, the longitudinal directions of the plurality recesses 82d are positioned to be perpendicular in relation to the opened slots of the slot antenna plate. Other shapes of the recess 82d are the same as those of the recesses 47, and descriptions thereof will be omitted.

Exemplary embodiments of the present disclosure have been described with reference to drawings, but the present disclosure is not limited to the illustrated exemplary embodiments. It is possible to make various modifications or changes in the illustrated exemplary embodiments within the same or equivalent scope of the present disclosure.

DESCRIPTION OF SYMBOLS

11: plasma treatment device, 12: processing container, 13: gas supply unit, 14: supporting unit, 15: microwave generator, 16: waveguide, 17: coaxial waveguide, 18: dielectric member, 19a: bottom portion, 19b: side wall, 19c: annular member, 19d: end surface, 19e: O-ring receiving recess, 20: exhaust hole, 21: O ring, 22a: central conductor, 22b: outer conductor, 23, 25: gas supply hole, 24: center gas supply unit, 26: outer gas supply unit, 27: hollow member, 28: supporting member, 29: matching unit, 30: mode converter, 31: slot antenna plate, 32, 33: slot, 34: slot pair, 37, 42: through hole, 38, 44, 59: center, 41, 62, 64, 71, 81a, 81b, 81c, 81d: dielectric window, 43: receiving recess, 45: injector unit, 46, 74, 83a, 83b, 83c, 83d: bottom surface, 47, 66, 72, 82a, 82b, 82c, 82d: recess, 51, 84a, 84b, 84c, 84d: base surface, 52, 54, 56: circumferential edge, 53, 85a, 85b, 85c, 85d: side surface, 55, 73, 86a, 86b, 86c, 86d: inclined surface, 57, 58, 61a, 61b, 61c, 61d, 61e: region (area), 63, 65: space, 87a: top portion, 87b, 87c, 87d: curved surface, 88a: edge, 88d: virtual line.

What is claimed is:

1. A dielectric window for a plasma treatment device which is provided in a plasma treatment device using microwaves as a plasma source,
   wherein the dielectric window for the plasma treatment device is formed in a disk shape and configured to propagate the microwaves,
   wherein a recess is provided on a bottom surface of the dielectric window, in which the bottom surface becomes a plasma generation side when the dielectric window is provided in the plasma treatment device, an opening of the recess becomes the bottom surface side, and the recess is recessed inwardly in a plate thickness direction of the dielectric window, and
   wherein the recess is constituted by a base surface which extends in a direction perpendicular to the plate thickness direction of the dielectric window, a side surface which extends in the plate thickness direction of the dielectric window toward the opening side of the recess from a circumferential edge of the base surface, and an inclined surface which extends at an incline with respect to the plate thickness direction of the dielectric window from an opening side circumferential edge of the side surface toward the opening side of the recess.

2. The dielectric window of claim 1, wherein a plurality of recesses is provided in the dielectric window.

3. The dielectric window of claim 2, wherein the plurality of recesses are concentrically provided.

4. The dielectric window of claim 2, wherein the plurality of recesses have a rotational symmetry about a center of the dielectric window when the dielectric window is viewed in the plate thickness direction.

5. The dielectric window of claim 1, wherein an angle between the bottom surface and the inclined surface ranges from 40° to 60° in a cross-sectional view of the dielectric window when cut along a plane which includes the recess and extends in the plate thickness direction of the dielectric window.

6. The dielectric window of claim 1, wherein the inclined surface includes a curved surface.

7. A plasma treatment device using microwaves as a plasma source, comprising:
   a processing container configured to perform a plasma treatment on a substrate;
   a gas supply unit configured to supply a gas for the plasma treatment into the processing container;
   a supporting unit provided within the processing container and configured to support the substrate;
   a microwave generator configured to generate microwaves for plasma for excitation;
   a waveguide and a coaxial waveguide configured to introduce the microwaves into the processing container;
   a dielectric member connected to a lower end portion of the coaxial waveguide to radially propagate the microwaves introduced by the coaxial waveguide;
   a slot antenna plate disposed below the dielectric member; and
   a dielectric window for a plasma treatment device which is formed in a disk shape and configured to propagate the microwaves,
   wherein a recess is provided on a bottom surface of the dielectric window, in which the bottom surface becomes a plasma generation side when the dielectric window is provided in the plasma treatment device, an opening of the recess becomes the bottom surface side, and the recess is recessed inwardly in a plate thickness direction of the dielectric window, and
   wherein the recess is constituted by a base surface which extends in a direction perpendicular to the plate thickness direction of the dielectric window, a side surface which extends in the plate thickness direction of the dielectric window toward the opening side of the recess from a circumferential edge of the base surface, and an inclined surface which extends at an incline with respect to the plate thickness direction of the dielectric window from an opening side circumferential edge of the side surface toward the opening side of the recess.

8. The plasma treatment device of claim 7, wherein the slot antenna plate is formed in a disk shape and provided with a plurality of slots penetrating in the plate thickness direction of the slot antenna plate, and the slot antenna plate is disposed at a top side of the dielectric window to radiate the microwaves toward the dielectric window.

9. A dielectric window for a plasma treatment device which is provided in a plasma treatment device using microwaves as a plasma source,
   wherein the dielectric window for the plasma treatment device is formed in a disk shape and configured to propagate the microwaves,
   wherein a recess is provided on a bottom surface of the dielectric window in which the bottom surface becomes a plasma generation side when the dielectric window is provided in the plasma treatment device, an opening of the recess becomes the bottom surface side, and the recess is recessed inwardly in a plate thickness direction of the dielectric window,
   wherein the recess is constituted by a base surface which extends in a direction perpendicular to the plate thickness direction of the dielectric window, a side surface which extends in the plate thickness direction of the dielectric window toward the opening side of the recess from a circumferential edge of the base surface, and an inclined surface which extends at an incline with respect to the plate thickness direction of the dielectric window from an opening side circumferential edge of the side surface toward the opening side of the recess, and
   wherein at least one of portions between the base surface and the side surface, between the side surface and the inclined surface, and between the inclined surface and the bottom surface is joined by a curved surface.

10. A dielectric window for a plasma treatment device which is provided in a plasma treatment device using microwaves as a plasma source, wherein the dielectric window for the plasma treatment device is formed in a disk shape and configured to propagate the microwaves, wherein a recess is provided on a bottom surface of the dielectric window in which the bottom surface becomes a plasma generation side when the dielectric window is provided in the plasma treatment device, an opening of the recess becomes the bottom surface side, and the recess is recessed inwardly in a plate thickness direction of the dielectric window, wherein the recess is constituted by a base surface which extends in a direction perpendicular to the plate thickness direction of the dielectric window, a side surface which extends in the plate thickness direction of the dielectric window toward the opening side of the recess from a circumferential edge of the base surface, and an inclined surface which extends at an incline with respect to the plate thickness direction of the dielectric window from an opening side circumferential edge of the side surface toward the opening side of the recess, and wherein the recess is recessed in the form of an elongated hole.

* * * * *